United States Patent
Gill et al.

(10) Patent No.: US 11,289,638 B2
(45) Date of Patent: Mar. 29, 2022

(54) SUPERCONDUCTING QUBIT LIFETIME AND COHERENCE IMPROVEMENT VIA BACKSIDE ETCHING

(71) Applicant: INTERNATIONAL BUSINESS MACHINES CORPORATION, Armonk, NY (US)

(72) Inventors: Douglas Max Gill, South Orange, NJ (US); Martin O. Sandberg, Ossining, NY (US); Vivekananda P. Adiga, Ossining, NY (US); Yves Martin, Ossining, NY (US); Hanhee Paik, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 5 days.

(21) Appl. No.: 16/908,704

(22) Filed: Jun. 22, 2020

(65) Prior Publication Data
US 2021/0399192 A1    Dec. 23, 2021

(51) Int. Cl.
*H01L 39/02*    (2006.01)
*H01L 39/22*    (2006.01)
(Continued)

(52) U.S. Cl.
CPC ............ *H01L 39/025* (2013.01); *H01L 27/18* (2013.01); *H01L 39/223* (2013.01); *H01L 39/2493* (2013.01); *H01L 39/12* (2013.01)

(58) Field of Classification Search
CPC ..... H01L 39/025; H01L 27/18; H01L 39/223; H01L 39/2493; H01L 39/12
See application file for complete search history.

(56) References Cited

U.S. PATENT DOCUMENTS 7,411,187 B2   8/2008  Monroe et al.
9,836,699 B1  12/2017  Rigetti et al.
(Continued)

FOREIGN PATENT DOCUMENTS

WO   2017116439 A1   7/2017
WO   2019/032114 A1  2/2019
(Continued)

OTHER PUBLICATIONS

Chu et al., "Suspending superconducting qubits by silicon micromachining", Appl. Phys. Lett. 109, 112601 (2016); https://doi.org/10.1063/1.4962327.

(Continued)

*Primary Examiner* — Matthew L Reames
(74) *Attorney, Agent, or Firm* — Henry J. Daley; Venable LLP (57) ABSTRACT

A method for improving lifetime and coherence time of a qubit in a quantum mechanical device is provided. The method includes providing a substrate having a frontside and a backside, the frontside having at least one qubit formed thereon, the at least one qubit having capacitor pads. The method further includes at least one of removing an amount of substrate material from the backside of the substrate at an area opposite the at least one qubit or depositing a superconducting metal layer at the backside of the substrate at the area opposite the at least one qubit to reduce radiofrequency electrical current loss due to at least one of silicon-air (SA) interface, metal-air (MA) interface or silicon-metal (SM) interface so as to enhance a lifetime (T1) and a coherence time (T2) in the at least one qubit.

25 Claims, 9 Drawing Sheets

(51) Int. Cl.
  *H01L 27/18*  (2006.01)
  *H01L 39/24*  (2006.01)
  *H01L 39/12*  (2006.01)

(56) References Cited

U.S. PATENT DOCUMENTS

| | | |
|---|---|---|
| 10,008,655 B2 | 6/2018 | Chang et al. |
| 2019/0165237 A1* | 5/2019 | Hertzberg ......... H01L 23/53285 |
| 2020/0006619 A1 | 1/2020 | Fuhrer et al. |

FOREIGN PATENT DOCUMENTS

| | | |
|---|---|---|
| WO | 2019117975 A1 | 6/2019 |
| WO | 2021148251 A1 | 7/2021 |

OTHER PUBLICATIONS

PCT/EP2021/066475 International Search Report dated Nov. 15, 2021.
PCT/EP2021/066475 Written Opinion dated Nov. 15, 2021.

* cited by examiner

```
┌─────────────────────────────────────────────────────────────┐
│ Provide a substrate having a frontside and a backside, the  │
│ frontside having at least one qubit formed thereon, the at  │──1002
│ least one qubit comprising capacitor pads                   │
└─────────────────────────────────────────────────────────────┘
                              │
                              ▼
┌─────────────────────────────────────────────────────────────┐
│ At least one of removing an amount of substrate material    │
│ from the backside of the substrate at an area opposite the  │
│ at least one qubit or depositing a superconducting metal    │
│ layer at the backside of the substrate at the area opposite │
│ the at least one qubit to reduce radio frequency electrical │──1004
│ current loss due to at least one of silicon-air (SA)        │
│ interface, metal-air (MA) interface or silicon-metal (SM)   │
│ interface so as to enhance a lifetime (T1) and a coherence  │
│ time (T2) in the at least one qubit                         │
└─────────────────────────────────────────────────────────────┘
```

FIG. 10

SUPERCONDUCTING QUBIT LIFETIME AND COHERENCE IMPROVEMENT VIA BACKSIDE ETCHING

BACKGROUND

The currently claimed embodiments of the present invention relate to superconducting quantum mechanical devices, and more specifically, to a method for improving lifetime and coherence time of a qubit in a quantum mechanical device and a quantum mechanical device having one or more qubits with improved lifetime and coherence time.

In superconducting quantum computing systems the lifetime (T1) and coherence time (T2) of a qubit are fundamental metrics of system performance, where the general goal is to create a system where T1 and T2 are made to be as long as possible while maintaining appropriate associated qubit quantum interactions. Longer T1 and T2 times enables more sophisticated problems to be solved using a quantum computer since longer temporal metrics enable more complex calculations in quantum computers. T1 and T2 times have been improved by mitigating surface states that exist in the interface between various materials using front side etching. The surface states induce radiofrequency (RF) losses that degrade both T1 and T2. Currently, front side etching of a qubit is used to reduce existing surface states in proximity to the qubit shunting capacitor, which interact with RF energy and create loss. These lossy surface states can exist in silicon-air (SA), silicon-metal (SM), and metal-air (MA) interfaces. RF loss mechanisms can include SA, SM, and MA surface states as well as contributions from the bulk Si loss tangent.

Conventionally, qubit performance specifications have been modified via front side etching. However, front side etching is not desirable because (i) it significantly perturbs the qubit where electromagnetic (e.g., microwave or radiofrequency) field strengths are very strong, (ii) the front side etching cannot be performed once a chip is flip chip bump bonded without de-bonding the chip to do further processing, and (iii) the bump bonding process itself could have an influence on final qubit performance metrics.

SUMMARY

An aspect of the present invention is to provide a method for improving lifetime and coherence time of a qubit in a quantum mechanical device. The method includes providing a substrate having a frontside and a backside, the frontside having at least one qubit formed thereon, the at least one qubit having capacitor pads; and at least one of removing an amount of substrate material from the backside of the substrate at an area opposite the at least one qubit or depositing a superconducting metal layer at the backside of the substrate at the area opposite the at least one qubit to reduce radiofrequency electrical current loss due to at least one of silicon-air (SA) interface, metal-air (MA) interface or silicon-metal (SM) interface so as to enhance a lifetime (T1) and a coherence time (T2) in the at least one qubit.

In an embodiment, reducing radiofrequency electrical current loss includes reducing current loss by increasing radiofrequency overlap with lower loss geometric features in the quantum mechanical device and decreasing radiofrequency overlap with higher loss geometric features in the quantum mechanical device.

In an embodiment, removing the substrate material from the backside of the substrate at the area opposite the at least one qubit includes chemically etching the backside of the substrate selectively using a chemical etchant selected depending on the substrate material. In an embodiment, prior to chemically etching the backside of the substrate, forming an initial cavity in the backside of the substrate in a vicinity of the at least one qubit by mechanically removing material from the backside of the substrate and then chemically etching the backside of the substrate at the formed initial cavity. In an embodiment, forming the initial cavity in the backside of the substrate includes defining faces of the initial cavity having one or more first crystal planes and one or more second crystal planes so that the chemical etchant preferentially etches the substrate material from said one or more first crystal planes while substantially not etching substrate material from said one or more second crystal planes to form an etched final cavity in the vicinity of the at least one qubit.

In an embodiment, removing the amount of substrate material from the backside of the substrate includes removing the amount of substrate material in an area of the backside of the substrate to form a trench in a vicinity of a gap between capacitor pads of the at least one qubit. In an embodiment, removing the amount of substrate material in the area of the backside of the substrate to form the trench in the vicinity of the gap between the capacitor pads of the at least one qubit includes removing the amount of substrate material so that the trench is substantially centered around the gap between the capacitor pads of the at least one qubit.

In an embodiment, removing the amount of substrate so that the trench is substantially centered around the gap between the capacitor pads of the at least one qubit includes forming the trench to reduce a participation rate of surface states with RF energy density for silicon-metal (SM) interfaces and increasing a participation rate of surface states with the RF energy density for silicon-air (SA) interfaces. In an embodiment, RF energy density overlap with surface states in silicon-metal (SM) interfaces is reduced and the surface state RF energy density overlap for silicon-air (SA) interfaces is increased with increasing depth of the trench.

In an embodiment, removing the amount of substrate material from the backside of the substrate includes removing the amount of substrate material in an area of the backside of the substrate to form a trench in a vicinity of a gap between capacitor pads of the at least one qubit and depositing the superconducting metal layer within the trench so as to reduce the radiofrequency electrical current loss due to metal-air (MA) interfaces. In an embodiment, forming the trench in the vicinity of the gap between capacitor pads of the at least one qubit includes forming the trench below and centered around one of the capacitor pads of the at least one qubit. In an embodiment, the radiofrequency electrical current loss due to metal-air (MA) interface is decreased based on a backside width of the trench.

In an embodiment, removing the substrate material from the backside of the substrate at the area opposite the at least one qubit includes applying an etch mask film to the backside of the substrate and etching the selected area at the backside of the substrate opposite the at least one qubit. In an embodiment, the method further includes subsequent to applying the etch film mask to the backside of the substrate and prior to etching the selected area at the backside of the substrate, forming one or more openings in the etch film mask at the selected area. In an embodiment, etching the selected area at the backside of the substrate opposite the at least one qubit includes chemically etching a desired thickness of the substrate at the selected areas to form a trench at the selected area. In an embodiment, the method also includes depositing the superconducting metal layer within the trench.

In an embodiment, removing the substrate material from the backside of the substrate at the area opposite the at least one qubit includes applying a mask film to the backside of the substrate and depositing metal superconductor on masked areas of the backside of the substrate.

Another aspect of the present invention is to provide a quantum mechanical device. The quantum mechanical device includes a substrate having a frontside and a backside; and a plurality of qubits formed on the frontside of the substrate, the plurality of qubits having a plurality of capacitor pads. The substrate includes at least one trench formed on the backside of the substrate opposite at least one qubit of the plurality of qubits, and at least one of a size, a shape, or a position of the at least one trench or a superconducting material deposited therein are selected to reduce radiofrequency electrical current loss due to at least one of silicon-air (SA) interface, metal-air (MA) interface or silicon-metal (SM) interface, or any combination thereof, so as to enhance a lifetime (T1) and a coherence time (T2) in the at least one qubit.

In an embodiment, the substrate is selected from the group consisting of silicon, high resistivity silicon, and sapphire. In an embodiment, the plurality of capacitor pads are made from a superconducting material. In an embodiment, the superconducting material can be one of aluminum (Al) and niobium (Nb).

In an embodiment, the trench is provided in a vicinity of a gap between two capacitor pads of the plurality of capacitor pads. In an embodiment, the trench is substantially centered around the gap so as to reduce surface state energy density for silicon-metal (SM) interface and to increase surface state energy density for silicon-air (SA) interface.

In an embodiment, the superconducting metal layer is provided within the trench so as to reduce the radiofrequency electrical current loss due to metal-air (MA) interface. In an embodiment, the trench is formed below and centered around one or more of the plurality of capacitor pads.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

In embodiments of the present invention, RF overlap with the bulk silicon, air, and different material interfaces can be modified with backside etching and/or grounded backside metallization. Different loss mechanisms (i.e. bulk silicon loss tangent, SA, MA, and SM surface states) have different magnitudes, and qubit RF total loss is essentially a weighted average of the RF overlap with the various loss mechanisms associated with the specific geometric features of the qubit.

There is opportunity to enhance (e.g., maximize) the lifetime (T1) and coherence time (T2) by reducing (e.g., minimizing) the overall loss through increasing the RF overlap with low loss geometric features and decreasing the overlap with higher loss features.

Different process flows can be implemented to realize similar physical structures. Also, different fabrication lines may use different processing protocols. Both of these issues could change which material interfaces contribute the most to RF loss. Therefore, the material interface that is of most concern can change depending on the specific processing choices made during fabrication.

Therefore, it may be beneficial to have a flexible strategy for RF loss reduction (e.g., minimization) where the amount of RF overlap with various geometric features within the qubit can be manipulated to accommodate for different potential loss mechanisms that might result from differing process flows, with the goal of minimizing overall loss.

As further described in the following paragraphs, enhancing or increasing (e.g., maximizing) T1 and T2 in superconducting qubit systems can be accomplished by using two device modifications approaches. A first approach includes etching the substrate from the backside of the qubit or qubit chip. A second approach includes metalizing and grounding the backside of the qubit or qubit chip. These two approaches can be implemented separately or independently or can also implemented together if needed depending on a specific situation.

As will be shown in the following paragraphs, simulations show that fully backside etching qubits enables a reduction in RF overlap (or RF participation factor) with the silicon-air (SA) and silicon-metal (SM) surface states, as well as the bulk silicon. However, the metal-air (MA) overlap increases with the fully backside etched device geometry. The MA overlap can be reduced (e.g., minimized) by appropriately etching the backside of the chip in proximity to the qubit, and metallizing the chip backside and optionally grounding of the chip backside. Therefore, if RF impairments from the MA interfaces provide a smaller contribution to the loss than the bulk Si, for example, and the SA and SM contributions, an overall improvement in T1 and T2 can be accomplished when the qubit is fully backside etched. If the RF loss that results from the MA interfaces are a much more significant contributor to the RF loss, as compared to the bulk Si, and the SA and SM contributions, then the backside of the chip can be etched appropriately, metalized with a superconductor and optionally grounded to minimize overall RF loss. In the preset paragraphs, we often refer to silicon (Si) or bulk Si as an example of substrate. However, as it is appreciated and further described in the following paragraphs other materials can also be used, such as high resistivity silicon, and sapphire.

Figures 1A, 1B:
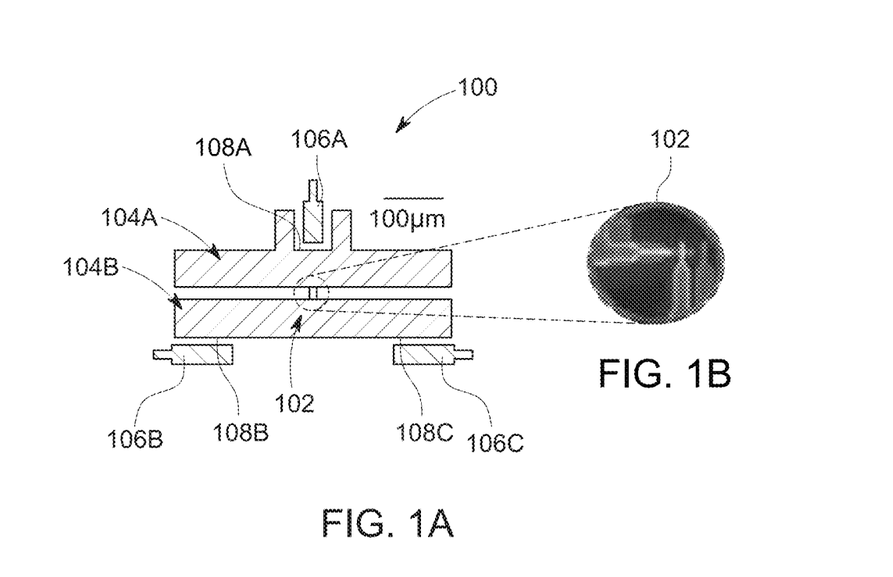
FIG. 1A is a schematic cross-section view of a qubit device, according to an embodiment of the present invention.
FIG. 1B is an Electron Microscope (EM) image of a Josephson junction of the qubit device, according to an embodiment of the present invention.

FIG. 1A is a schematic cross-section view of a qubit device 100, according to an embodiment of the present invention. As shown in FIG. 1A, the qubit device 100 includes Josephson junction 102 and capacitor pads 104A and 104B. The Josephson junction 102 is connected to capacitor pads 104A and 104B. The capacitor pads 104A and 104B can be in turn capacitively coupled to electromagnetic (e.g., microwave or radiofrequency) signal lines 106A, 106B and 106C via capacitors 108A, 108B and 108C, for example.

Figure 1C:
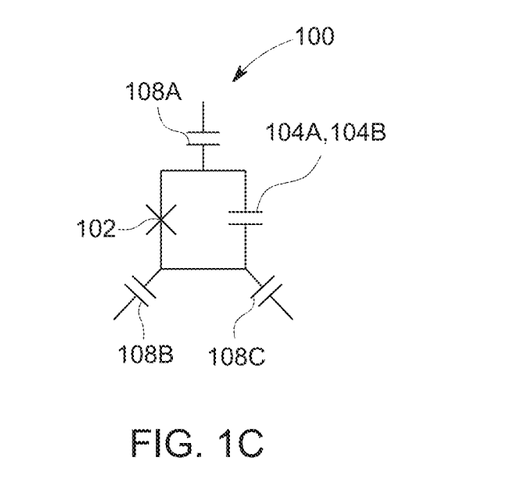
FIG. 1C is an electronic diagram of the qubit device coupled to electromagnetic signal lines via capacitors, according to an embodiment of the present invention.

FIG. 1B is an Electron Microscope (EM) image of the Josephson junction, according to an embodiment of the present invention. In an embodiment, the Josephson junction can have a size of about 100 by 100 nm². FIG. 1C is an electronic diagram of the qubit device 100 coupled to electromagnetic signal lines via capacitors 108A, 108B and 108C, according to an embodiment of the present invention. The Josephson junction 102 has an internal capacitance Cj and internal inductance $L_j$ (for example, $L_j$ is about 20 nH and $C_j$ is about 1 fF). However, as it must be appreciated, the internal inductance Lj and internal capacitance $C_j$ of the Josephson junction can have other values depending on the construction of the Josephson junction 102. In addition to the Josephson junction internal capacitance $C_j$, the qubit 100 also has a coupling capacitance or signal capacitance $C_s$ due to capacitor pads 104A and 104B. In an embodiment, the capacitance $C_s$ (from capacitor pads 104A and 104B) can be about 60 fF. However, the capacitance $C_s$ can also have other values depending on the size, geometry or shape of the capacitor pads 104A and 104B.

In an embodiment, the resonance frequency is determined by the capacitive and resistive contributions from both the Josephson junction (including the internal capacitance $C_j$ and inductance $L_j$) and the associated capacitor $C_s$ from the capacitor pads 104A and 104B. Therefore, for example, a first resonance frequency $f_{01}$ of a qubit depends on the device capacitance and can be expressed mathematically by the following equation (1). The "0" in the index indicates the ground state of the Josephson junction 102 and "1" in the index indicates the first excited state of the Josephson junction 102, for example.

$$f_{01} = \frac{1}{h}\sqrt{8\,E_j E_c} \qquad (1)$$

where energies $E_j$ and $E_c$ can be expressed by the following two equations (2) and (3).

$$E_c = \frac{e^2}{2C_\Sigma} \qquad (2)$$

$$E_J = \frac{hI_c}{2e} \qquad (3)$$

Where e is the electron charge, h is the Planck constant, $C_\Sigma$ is the sum of all capacitances, and $I_c$ is the critical current (Ambegaokar-Baratoff), given by the following equation (4).

$$I_c = \frac{1}{R_n}\frac{\pi\Delta}{2e} \qquad (4)$$

Where $R_n$ is the resistance of the Josephson Junction (JJ), and $\Delta$ is the superconducting energy gap, which is a material property that is independent of the material geometry, where the size of the superconducting energy gap is indicative of the energy gain of two electrons when they form a Cooper pair. The energy gap is temperature dependent and increases with decreasing temperature.

Therefore, by varying the radiofrequency field distribution associated with the capacitance $C_\Sigma$, which includes the contribution of the capacitance Cs, it is possible to change or vary the resonance frequency (for example, the first resonance frequency $f_{01}$) of the qubit and vary the overlap (or participation rate) of the radiofrequency electrical current with loss sources that are associated with at least one of silicon-air (SA) interface, metal-air (MA) interface or silicon-metal (SM) interface, which in turn can reduce the amount of overall radiofrequency loss so as to enhance a lifetime (T1) and a coherence time (T2) in the at least one qubit.

Figure 2:
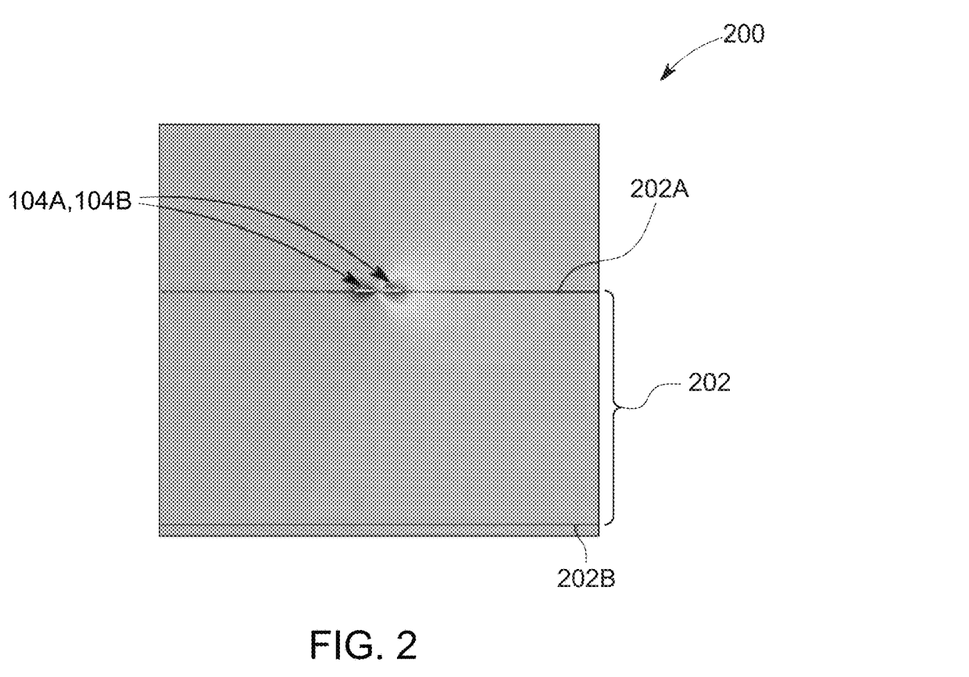
FIG. 2 is a contour map of a simulated two-dimensional electric field generated by the capacitor pads connected to the Josephson junction, according to an embodiment of the present invention.

FIG. 2 is a contour map of a simulated two-dimensional electric field generated by the capacitor pads 104A and 104B connected to the Josephson junction 102, according to an embodiment of the present invention. The two capacitor pads 104A and 104B of the qubit 100 are represented as bars in FIG. 2. The Josephson junction 102 (not shown) is located between the two bars 104A and 104B. For example, the left bar corresponding to capacitor pad 104A can be connected to a zero electric potential while the right bar corresponding to capacitor pad 104B can be connected to a higher electric potential of 1V (which could for example, result in a field strength of approximately 7 $10^3$ V/m). In FIG. 2, the electric contour map is superposed on a representation of the capacitor pads 104A, 104B which are part of the quantum mechanical device 200. The qubit 100 is also part of the quantum mechanical device 200 which also include a substrate 202. The substrate 202 has frontside 202A and a backside 202B. The capacitor pads 104A and 104B represented as bars in FIG. 2 and the Josephson junction 102 located between the two capacitor pads 104A and 104B of the qubit 100 are located on the frontside 200A of the substrate 202 of the quantum mechanical device 200.

Changes in electric field distribution are indicative of changes in the effective dielectric constant of the substrate 202. The capacitance of the quantum mechanical device 200 is related to the effective dielectric constant of the substrate 202. Changes in the electric field distribution can be implemented by changing a thickness of the substrate 200 at specific locations in the substrate 202. For example, this can be performed by etching the substrate 202 from the backside 202B, i.e., removing substrate material from the backside 202B. Changes in electric field distribution due to etching of the substrate 202 at the backside 202B are indicative of changes in the quantum mechanical device capacitance.

Figure 3:
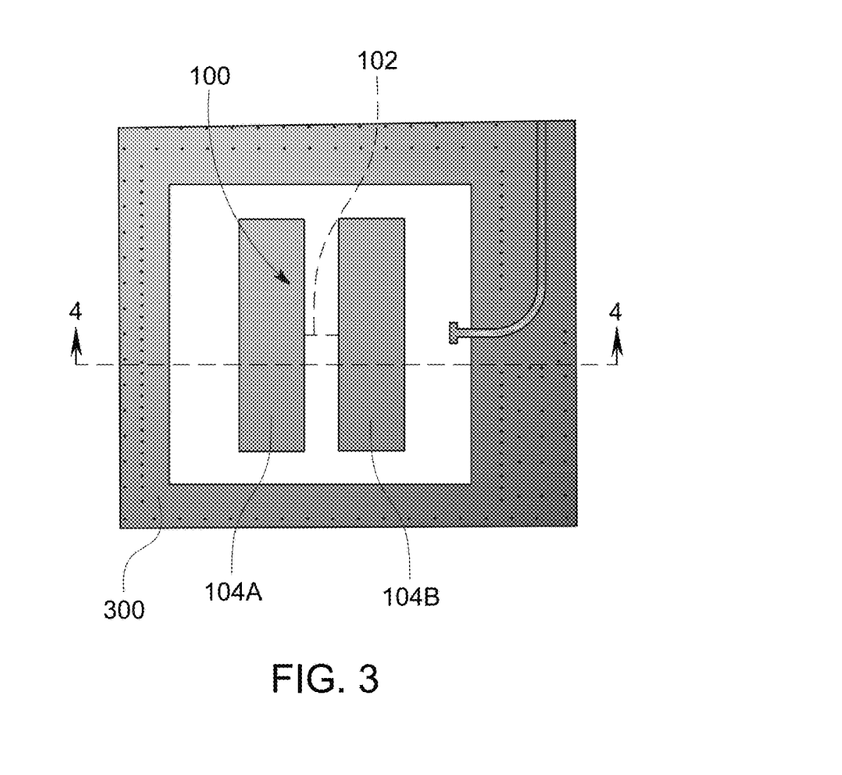
FIG. 3 is a schematic top view of the qubit device showing the relative position of the capacitor pads and the Josephson junction (JJ), according to an embodiment of the present invention.

FIG. 3 is a schematic top view of the qubit device 100 showing the relative position of the capacitor pads 104A and 104B and the Josephson junction (JJ) 102, according to an embodiment of the present invention. The qubit device 100 is surrounded by the ground plane 300 which is part of the quantum mechanical device 200.

Figure 4A:
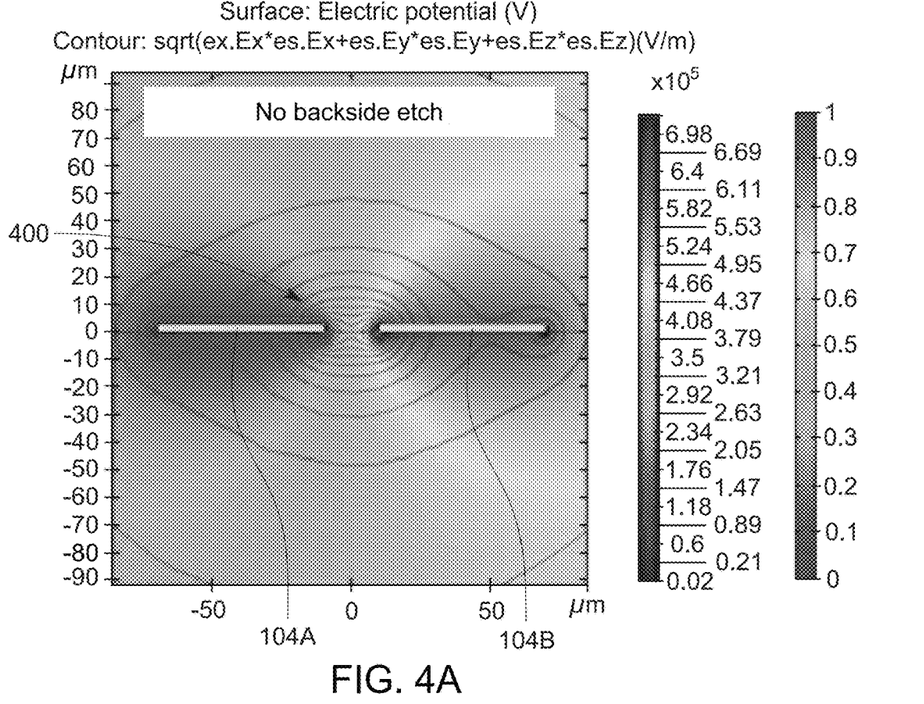
FIGS. 4A-4C are contour maps of a distribution of the electric potential around the capacitor pads, according to embodiments of the present invention.
Figure 4B:
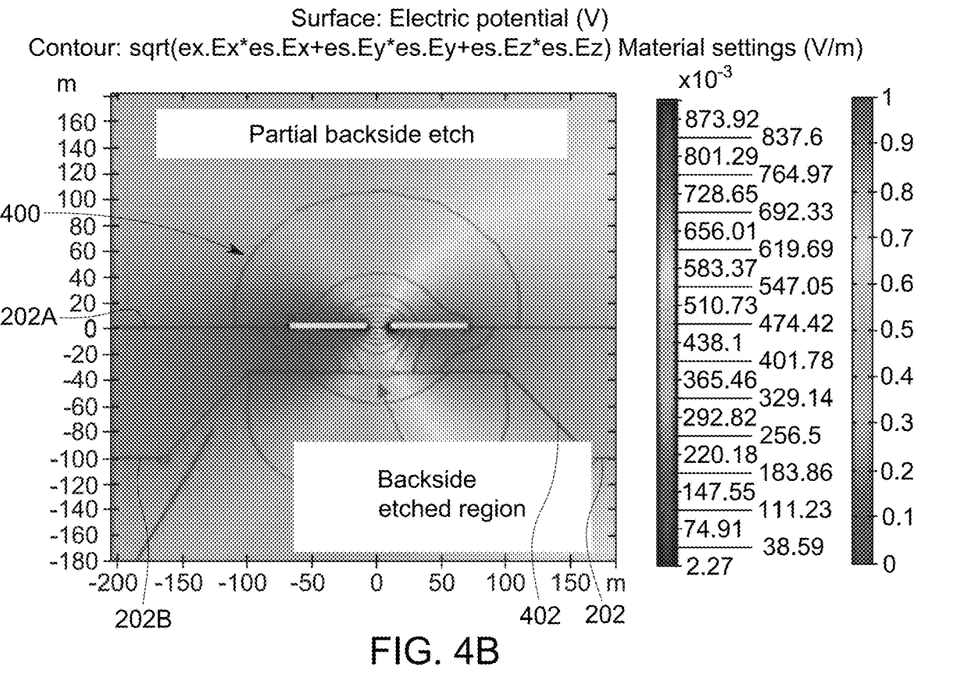
Figure 4C:
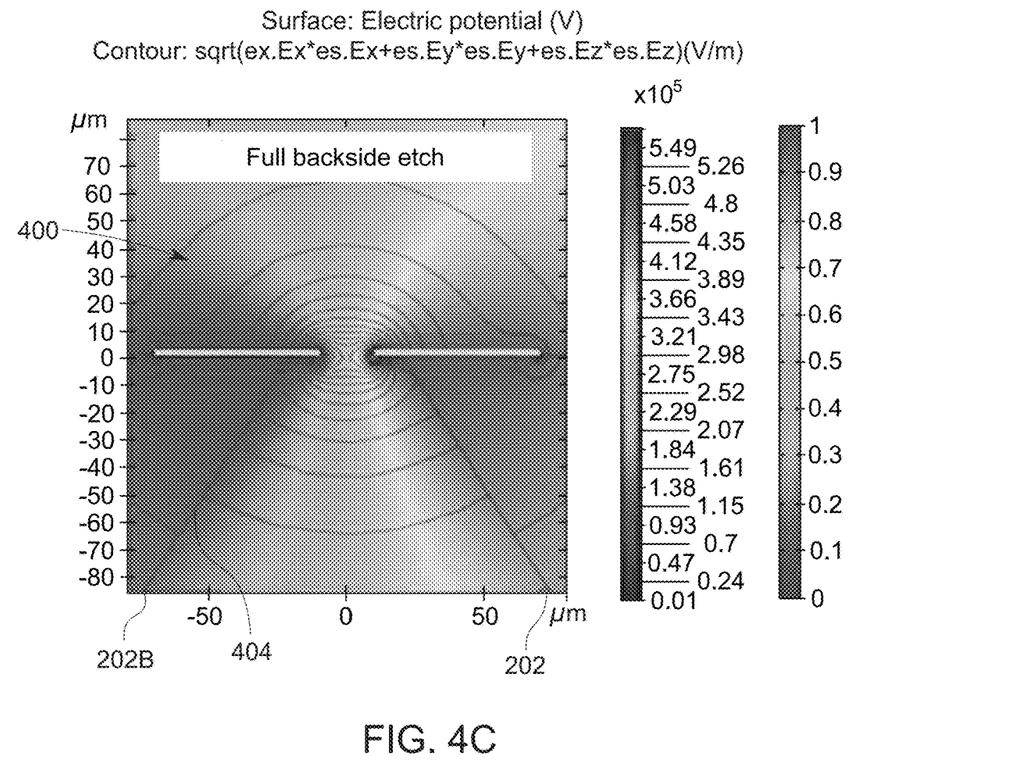

FIGS. 4A-4C are contour maps of a distribution of the electric potential around the capacitor pads 104A and 104B, according to embodiments of the present invention. FIG. 4A is a contour map of a simulated two-dimensional electric field generated by the capacitor pads 104A and 104B connected to the Josephson junction 102 along the cross-sectional line 4-4 shown in FIG. 3. Electrostatic calculations can be used to estimate the RF energy density overlap with various surface states. This is a reasonable approach as the RF wavelength is much larger than that of the device geometric dimensions. The electric potential contour lines 400 are drawn around the ends of the capacitor pads 104A and 104B. FIG. 4A shows the distribution the electric potential around the Josephson junction 102 with the backside 202B of the substrate 202 of the quantum mechanical device 200 being not etched. Ends of the capacitor pads 104A, 104B can be recognized by the presence of higher concentration of the electric potential 400. The Josephson junction 102 is located between an end of capacitor pad 104A and end of capacitor pad 104B. FIG. 4B shows the distribution of the electric potential around the Josephson junction 102. The Josephson junction 102 is also located between an end of capacitor pad 104A and an end of capacitor pad 104B. However, as shown in FIG. 4B, the backside 202B of the substrate 202 is etched in the vicinity of the Josephson junction 102. The profile of the etched material of the substrate 202 is shown as a trapezoid shape 402 wherein more material is removed in the vicinity of the Josephson junction 102 than away from the Josephson junction 102. The removal of material at the backside 202B of the substrate 202 modifies the shape of electric potential lines 400 and thus the distribution of the electric potential around or in the vicinity of the Josephson junction 102. Therefore, this indicates that the capacitance of the qubit 100 around the Josephson junction 102 and the capacitor pads 104A and 104B is altered. FIG. 4C shows the distribution of the electric potential around the Josephson junction 102. The Josephson junction 102 is also located between an end of capacitor pad 104A and an end of capacitor pad 104B. As shown in FIG. 4C, the backside 202B of the substrate 202 is etched in the vicinity of the Josephson junction 102 even further in comparison with the etching profile shown in FIG. 4B. The profile of the etched material of the substrate 202 is shown as a trapezoid shape 404 wherein even more material is removed in the vicinity of the Josephson junction 102 in comparison with the trapezoid profile 402 shown in FIG. 4B. The removal of material at the backside 202B of the substrate 202 modifies the shape of electric potential lines 400 and thus the distribution of the electric potential around or in the vicinity of the Josephson junction 102. Therefore, this indicates that the capacitance of qubit around the Josephson junction 102 and the capacitor pads 104A and 104B is altered even further in comparison with FIG. 4B.

Figure 5A:
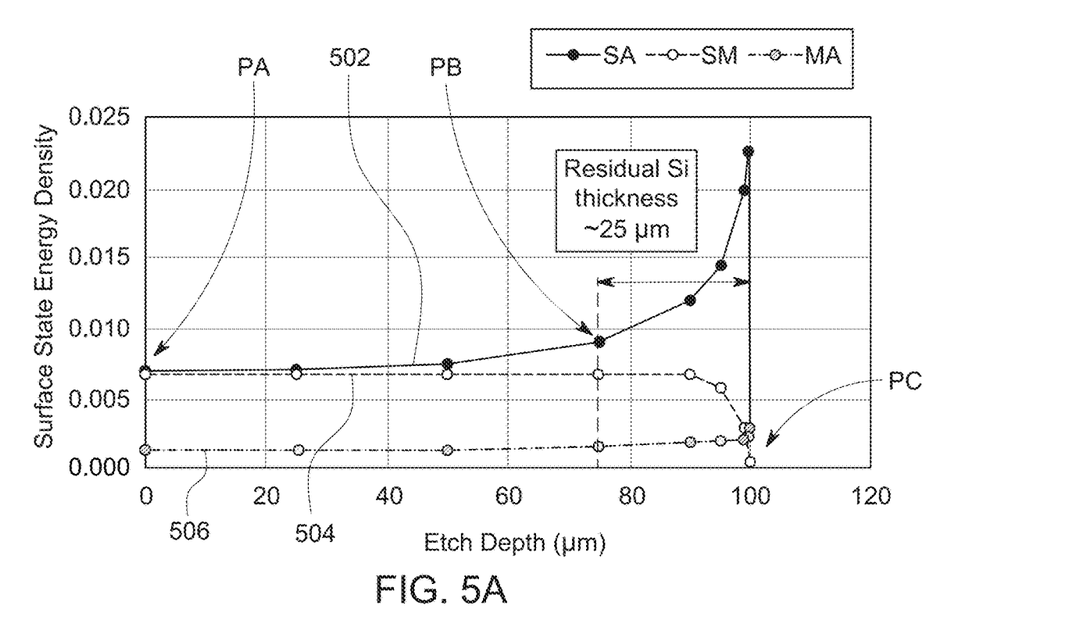
FIG. 5A shows a plot of a surface state energy density versus etch depth (in μm) corresponding to the amount of substrate material removed at a backside of a substrate, according to an embodiment of the present invention.

FIG. 5A shows a plot of a surface state energy density versus etch depth (in μm) corresponding to the amount of substrate material removed at the backside 202B of the substrate 202, according to an embodiment of the present invention. Curve 502 in FIG. 5A shows a variation of the surface state energy density for silicon-air (SA) interface as a function of the etch depth. Curve 504 in FIG. 5A shows a variation of the surface state energy density for silicon-metal (SM) interface as a function of the etch depth. Curve 506 in FIG. 5A shows a variation of the surface state energy density for metal-air (MA) interface as a function of the etch depth.

As shown in FIG. 5A, the more material is removed from the backside of the qubit 100 to form the trench 402, 404 with increasing depth, as depicted in FIGS. 4A-4C, a participation rate of surface states with the RF energy density for silicon-air (SA) interfaces is increased (curve 502). As shown in FIG. 5A, the more material is removed from the backside of the qubit to form the trench with increasing depth, as depicted in FIGS. 4A-4C, a participation rate of surface states with RF energy density for silicon-metal (SM) interfaces is reduced (curve 504). As shown in FIG. 5A, the more material is removed from the backside of the qubit to form the trench with increasing depth, as depicted in FIGS. 4A-4C, a participation rate of surface states with the RF energy density for metal-air (MA) interfaces remains substantially flat or constant (curve 506). Point "PA" in FIG. 5A corresponds to the configuration shown in FIG. 4A where no material is removed from the backside 202B the substrate 202. Point "PB" in FIG. 5A corresponds to the configuration shown in FIG. 4B where relatively less material is removed from the backside 202B the substrate 202. Point "PC" in FIG. 5A corresponds to the configuration shown in FIG. 4C where relatively more material is removed from the backside 202B the substrate 202. Point "PC" corresponds to the configuration shown in FIG. 4C where substantially no material is left at the area directly beneath the Josephson junction. At the point "PC", the curve 502 drops sharply.

As shown in FIG. 5A, the RF overlap with SA surface states is reduced greater than about 90%, the RF overlap with SM surface states is reduced greater than about 90%, and the RF overlap with MA surface states is increased greater than about 2 times.

Figure 5B:
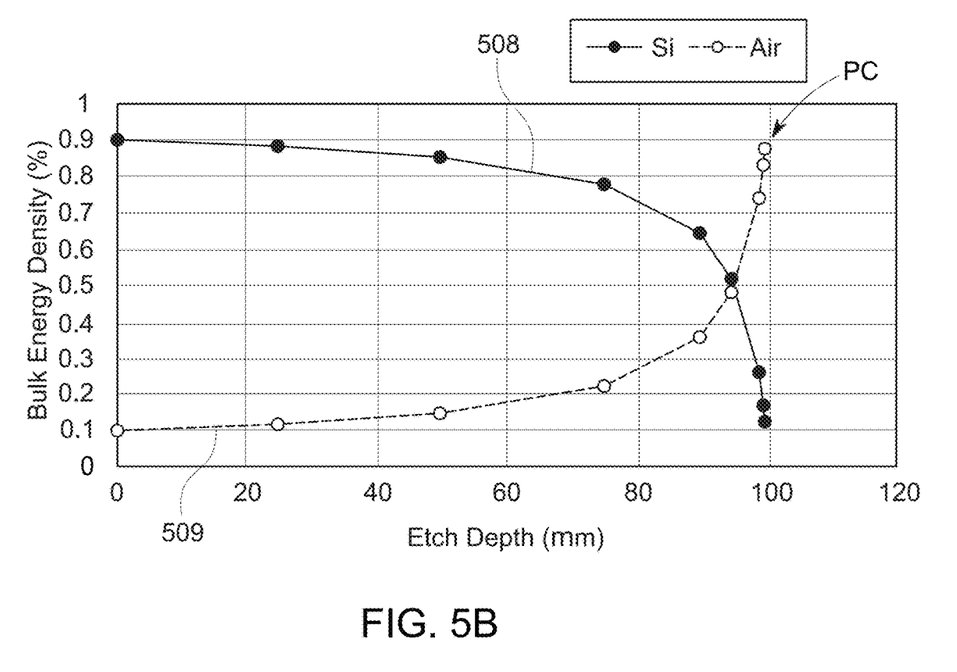
FIG. 5B shows a bulk energy density versus etch depth (in μm) corresponding to an amount of substrate material removed at the backside of the substrate, according to an embodiment of the present invention.

FIG. 5B shows a bulk energy density versus etch depth (in μm) corresponding to the amount of substrate material removed at the backside 202B of the substrate 202, according to an embodiment of the present invention. Curve 508 in FIG. 5B shows a variation of the bulk energy density for silicon as a function of the etch depth. Curve 509 in FIG. 5B shows a variation of the bulk energy density for air as a function of the etch depth. As shown in FIG. 5B, the more material is removed from the backside of the qubit 100 to form the trench 402, 404 with increasing depth, as depicted in FIGS. 4A-4C, a participation rate of the bulk energy density for silicon is decreased (curve 508). As shown in FIG. 5B, the more material is removed from the backside of the qubit 100, 200 to form the trench 402, 404 with increasing depth, as depicted in FIGS. 4A-4C, a participation rate of the bulk energy density for air is increased (curve 509). As shown in FIG. 5B, at point "PC", the RF overlap with silicon is reduced about 85% to about 15%, and the RF overlap with air is increased greater than about 8 times to about 85%.

Figure 6:
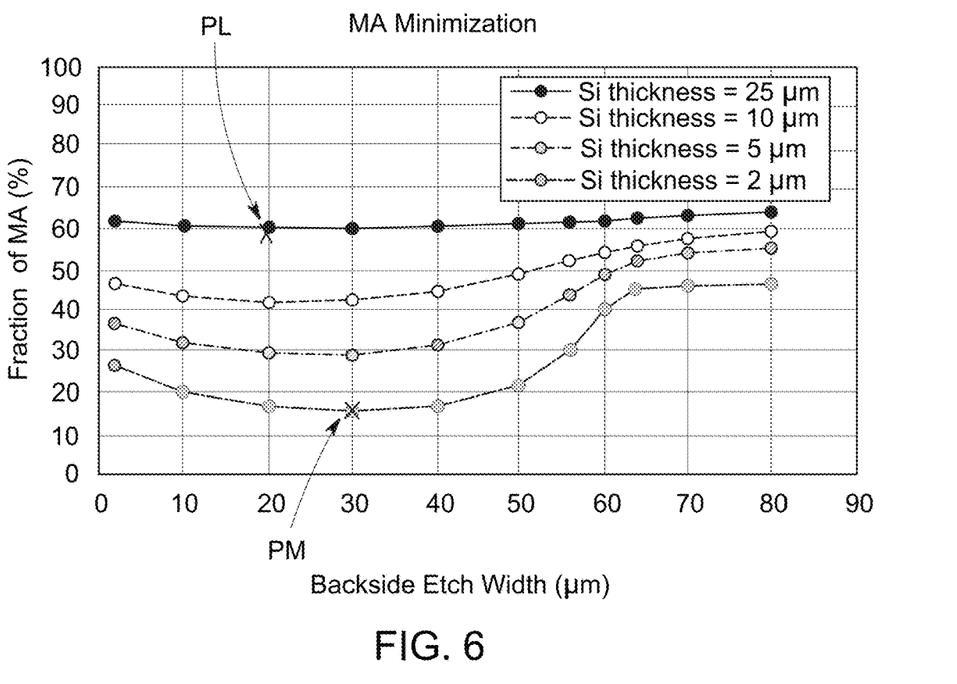
FIG. 6 shows a plot of a percent fraction of metal-air (MA) overlap versus a backside etch width, according to an embodiment of the present invention.

FIG. 6 shows a plot of a percent fraction of MA versus a backside etch width, according to an embodiment of the present invention. The term "backside etch width" refers herein to a width of the trapezoid trench at the apex of the trapezoid trench (i.e., at the thinnest point in the substrate). The various curves in the plot of FIG. 6 correspond as indicated therein to increasing etch depth from the top curve to the bottom curve. For example, the top curve corresponds to a substrate thickness (e.g., Si) at the apex of the trapezoid trench of 25 μm, whereas the bottom curve corresponds to a substrate (e.g., Si) thickness at the apex of the trapezoid trench of 2 μm. The variation of the fraction of MA as a function of backside etch width is more pronounced for a deepest trench, i.e., thinnest portion of substrate near the qubit, as shown by the bottom curve in FIG. 6.

Figure 7A:
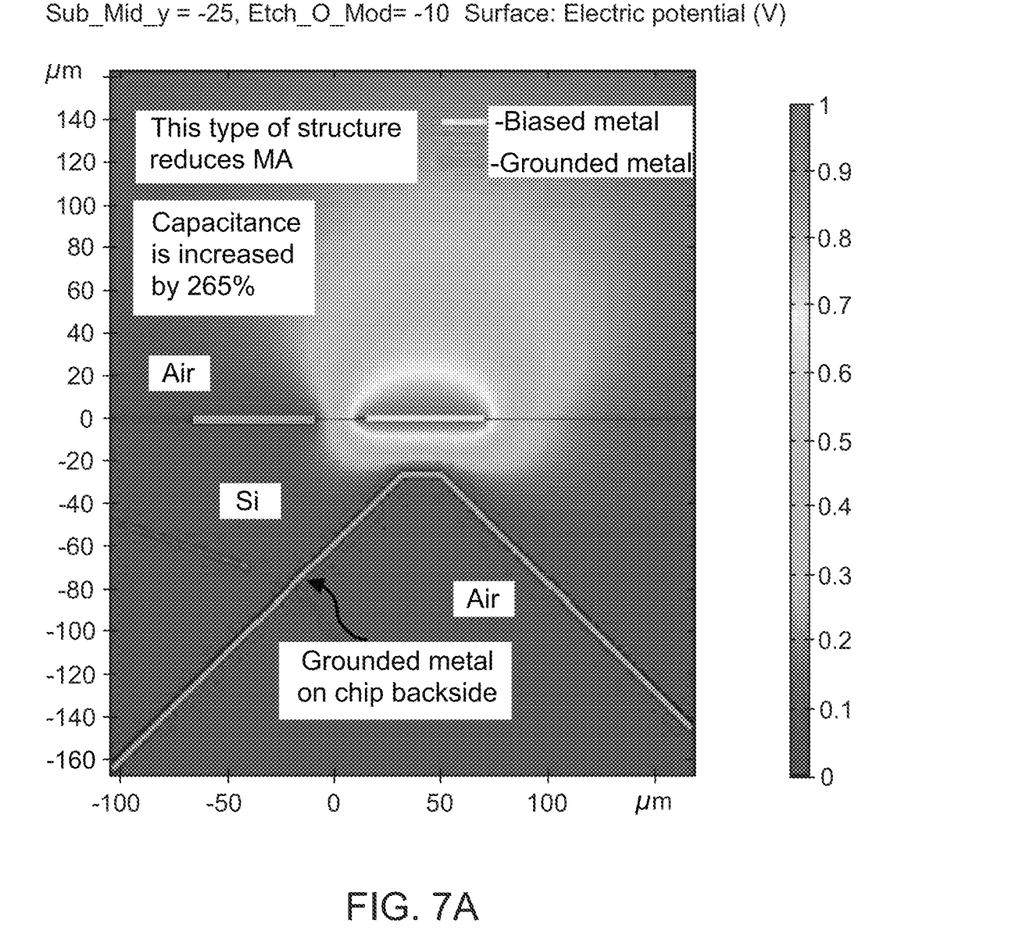
FIGS. 7A and 7B are contour maps of a distribution of the electric potential around the capacitor pads when a trench is formed under one of the capacitor pads, according to embodiments of the present invention.
Figure 7B:
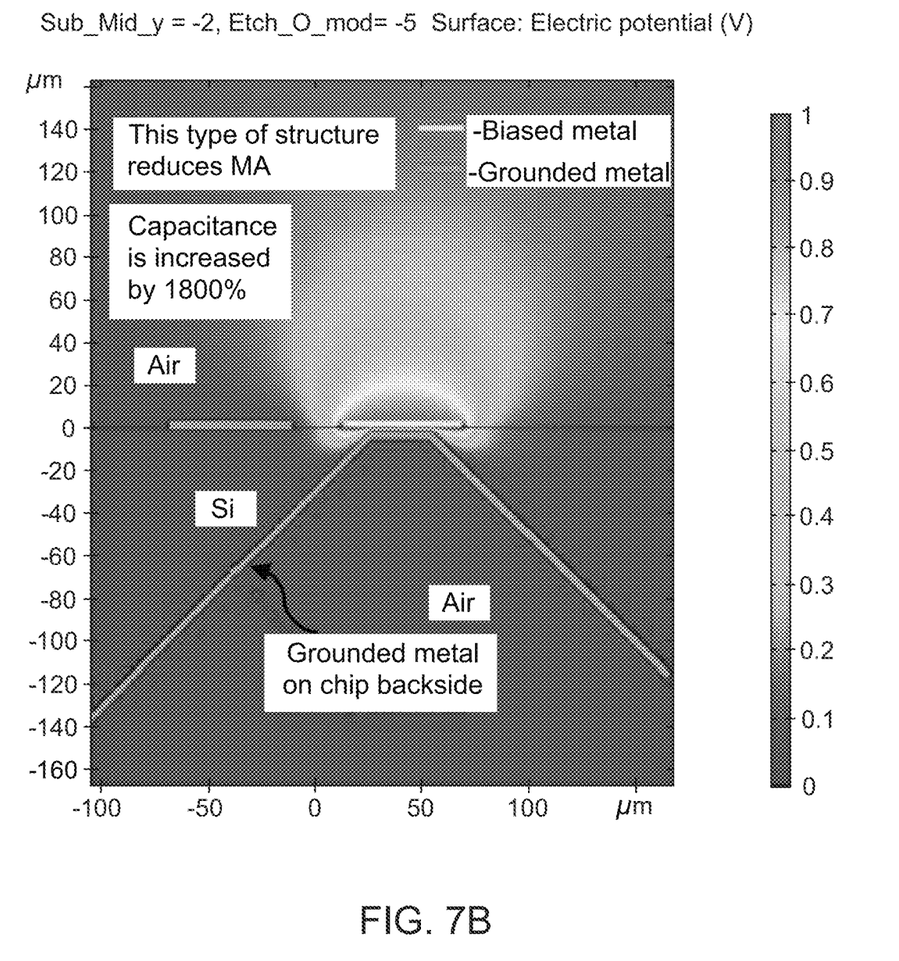

FIGS. 7A and 7B are contour maps of a distribution of the electric potential around the capacitor pads 104A and 104B when a trench is formed under one of the capacitor pads, according to embodiments of the present invention. In an embodiment, as shown in FIGS. 7A and 7B, one of the capacitor pads is biased whereas the other capacitor pad is grounded. In an embodiment, the trench is positioned directly beneath the biased capacitor pads so as to alter the potential electric field generated around a specific capacitor pad. In an embodiment, a metal layer can be deposited within the trench. The metal layer can be grounded. It is noted that there is an increase in capacitance when the substrate is etched in this way, which creates a corresponding change in qubit operational frequency. To maintain proper operational frequency the shunting capacitor geometric features can be modified to reduce its overall capacitance to be closer to that of the unetched device example, which will then have an additional impact on the RF energy density overlap factor with various surface state regions.

FIG. 7A shows a device profile that provides the fraction of MA corresponding to point "PL" in FIG. 6. This device profile reduces RF energy density overlap with MA by approximately 40% as compared to the unetched design with no backside metal, and is meant as an example representation of the concept that the energy density overlap with different surface state species can be minimized by appropriately modifying the device profile geometry. The RF overlap with silicon is increased to approximately 95%. The RF overlap with Air is decreased to approximately 5%. The RF overlap with SA surface states is decreased approximately 40%. The RF overlap with SM surface states is increased approximately 40%. The RF overlap with MA surface states is decreased approximately 40%.

FIG. 7B shows a device profile that provides the fraction of MA corresponding to point "PM" in FIG. 6. This device profile reduces RF energy density overlap with MA by approximately 85% as compared to the unetched design with no backside metal, and is meant as an example representation of the concept that the energy density overlap with different surface state species can be minimized by appropriately modifying the device profile geometry. The RF overlap with silicon is increased to approximately 99%. The RF overlap with Air is decreased to approximately 1%. The RF overlap with SA surface states is decreased approximately 85%. The RF overlap with SM surface states is increased about 14 times. The RF overlap with MA surface states is decreased approximately 85%.

Figure 8:
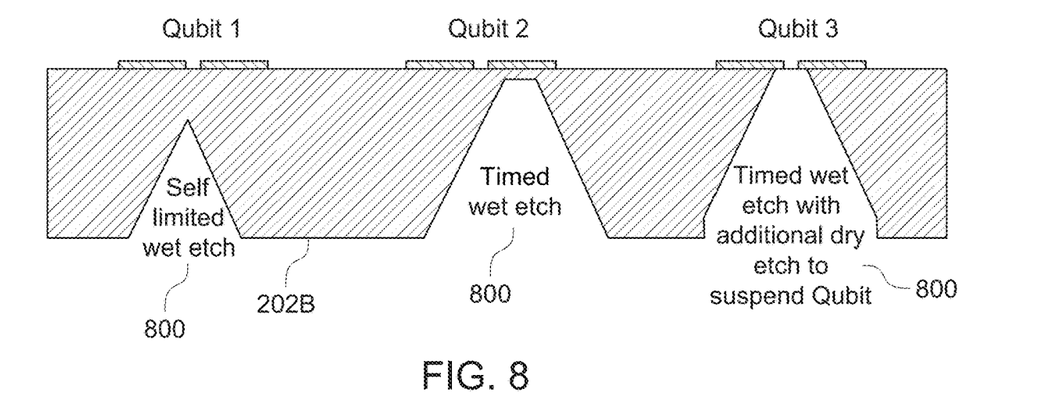
FIG. 8 shows a schematic representation of a plurality of qubits having respective geometric etched trenches, according to an embodiment of the present invention.

FIG. 8 shows a schematic representation of a plurality of qubits having respective geometric etched trenches, according to an embodiment of the present invention. As illustrated in FIG. 8, the geometric shape of the backside etching can be changed by changing the process flow used to implement the substrate backside etching, using a chemical etchant such as KOH or TMAH, in combination with dry etching, for example. In addition, anisotropic etching, and the resulting self-limited etch features, allows a variety of geometric profiles to be achieved with backside etching. For example, substrate material can be removed from the backside of the substrate at the area opposite the at least one qubit by using selective chemical etching. The chemical etchant can be selected depending on the substrate material. In an embodiment, prior to chemically etching the backside, one or more initial cavities can be formed in the backside of the substrate in a vicinity of the at least one qubit by, for example, mechanically removing material from the backside of the substrate. Following the mechanical removal, for example, chemical etching the backside of the substrate at the formed initial cavity can be performed. By forming the initial cavity in the backside of the substrate, faces of the initial cavity having one or more first crystal planes and one or more second crystal planes can be defined so that the chemical etchant preferentially etches the substrate material from one or more first crystal planes while substantially not etching substrate material from one or more second crystal planes to form an etched final cavity or trench in the vicinity of the at least one qubit.

FIG. 8 further depicts the backside 202B of the substrate 202 having a plurality of trenches 800, according to an embodiment of the present invention. For example, the size and/or the shape of the trenches can be controlled by selecting an appropriate shape for the initial cavities. In this way, the etching of the substrate material stops when the one or more first crystal planes (e.g., (111)-plane) are substantially eliminated so as to form size self-limited etched final trenches 800. In an embodiment, controlling the amount of material etched includes controlling an etching depth of the etched final trenches from the backside to the frontside of the substrate 202.

Figure 9A:
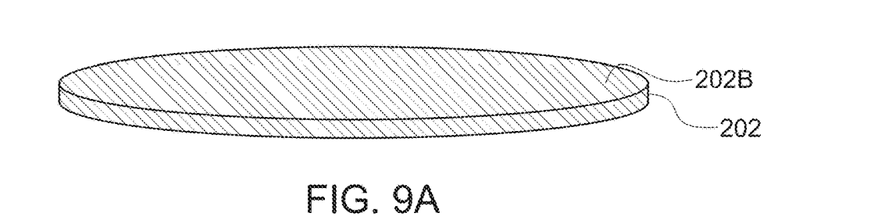
FIGS. 9A-9D show the process steps for removing substrate material from the backside of the substrate at an area opposite the at least one qubit (qubit 1, qubit 2, qubit 3), according to an embodiment of the resent invention.
Figure 9B:
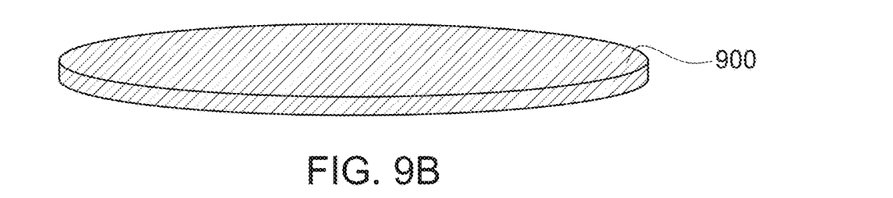
Figure 9C:
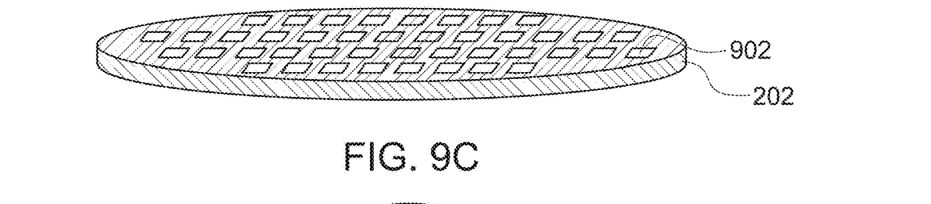
Figure 9D:
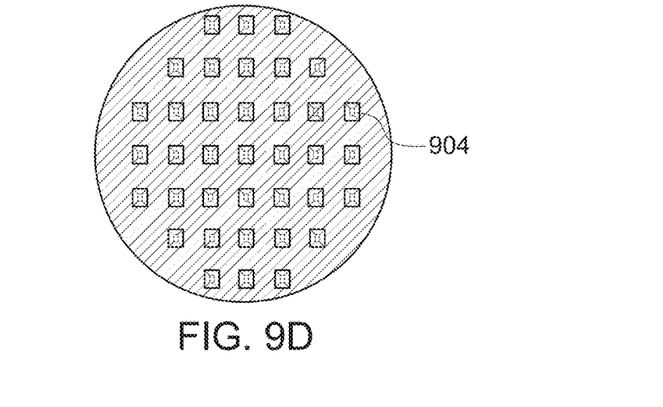

FIGS. 9A-9D show the process steps for removing substrate material from the backside 202B of the substrate 202 at the area opposite the at least one qubit 100 (qubit 1, qubit 2, qubit 3), according to an embodiment of the present invention. An etch mask film 900 (shown in FIG. 9B) can be applied to the backside 202B of the substrate 202 (shown in FIG. 9A) and etching selected areas 902 (shown in FIG. 9C) at the backside 202B of the substrate 202 opposite the at least one qubit 100 (not shown in FIG. 9C). In an embodiment, applying the etch mask film 900 to the backside 202B of the substrate 202 includes depositing niobium (Nb) on the backside 202B of the substrate 202. In another embodiment, applying the etch mask film 900 to the backside 202B of the substrate 202 includes depositing an oxide or silicon nitride (SiN) on the backside 202B of the substrate 202. FIG. 9D shows a patterned backside mask film on an etched qubit wafer depicting the plurality of trenches 904 formed therein.

In an embodiment, after applying or creating the etch mask 900 on the substrate 202, processing the substrate 202 by performing aluminum evaporation on the frontside of the substrate 202 to create the capacitor pads, the Josephson junction, etc. The backside coated processed substrate is then diced to create a plurality of chips having one or more qubits.

Figure 10:
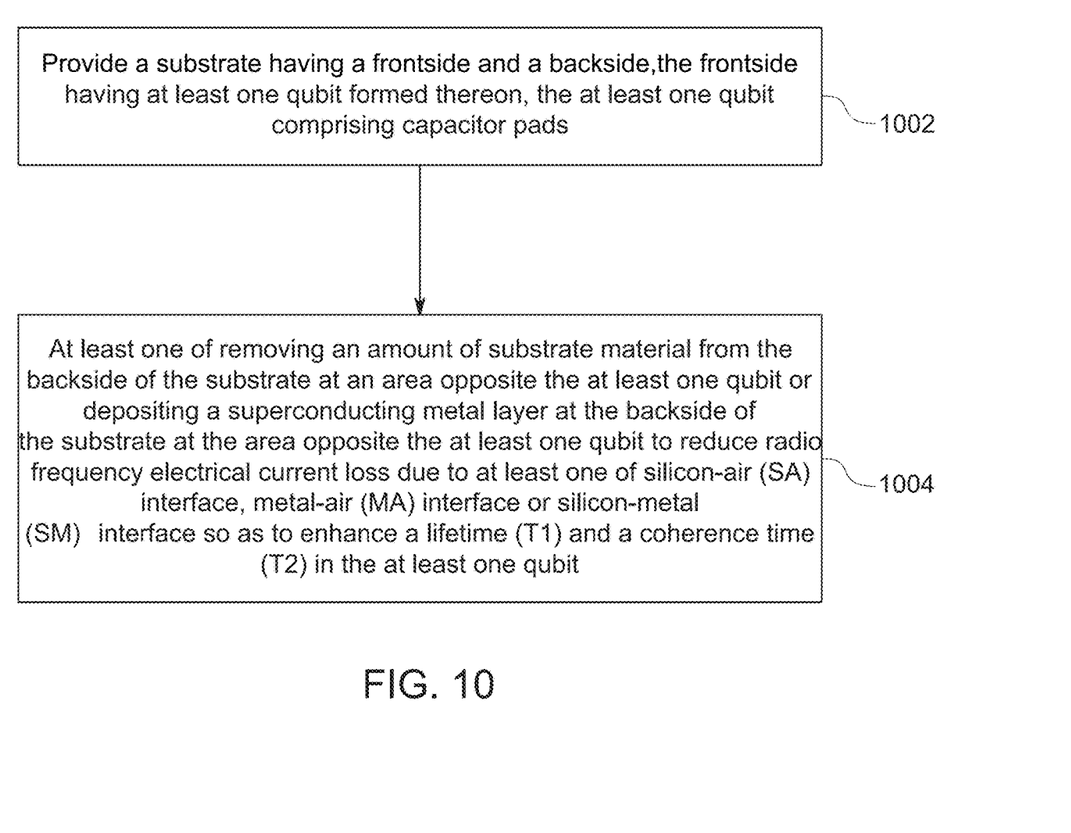
FIG. 10 is a flow chart of method for improving lifetime and coherence time of a qubit in a quantum mechanical device, according to an embodiment of the present invention.

FIG. 10 is a flow chart of method for improving lifetime and coherence time of a qubit in a quantum mechanical device, according to an embodiment of the present invention. The method includes providing a substrate having a frontside and a backside, the frontside having at least one qubit formed thereon, the at least one qubit including capacitor pads, at 1002. The method further includes at least one of removing an amount of substrate material from the backside of the substrate at an area opposite the at least one qubit or depositing a superconducting metal layer at the backside of the substrate at the area opposite the at least one qubit to reduce radiofrequency electrical current loss due to at least one of silicon-air (SA) interface, metal-air (MA) interface or silicon-metal (SM) interface so as to enhance a lifetime (T1) and a coherence time (T2) in the at least one qubit, at 1004. In an embodiment, the superconducting metal layer can be grounded.

In an embodiment, reducing radiofrequency electrical current loss includes reducing current loss by increasing radiofrequency overlap with lower loss geometric features in the quantum mechanical device and decreasing radiofrequency overlap with higher loss geometric features in the quantum mechanical device.

In an embodiment, removing the substrate material from the backside of the substrate at the area opposite the at least one qubit includes chemically etching the backside of the substrate selectively using a chemical etchant selected depending on the substrate material. In an embodiment, prior to chemically etching the backside of the substrate, forming an initial cavity in the backside of the substrate in a vicinity of the at least one qubit by mechanically removing material from the backside of the substrate and then chemically etching the backside of the substrate at the formed initial cavity. In an embodiment, forming the initial cavity in the backside of the substrate includes defining faces of the initial cavity having one or more first crystal planes and one or more second crystal planes so that the chemical etchant preferentially etches the substrate material from said one or more first crystal planes while substantially not etching substrate material from said one or more second crystal planes to form an etched final cavity in the vicinity of the at least one qubit.

In an embodiment, removing the amount of substrate material from the backside of the substrate includes removing the amount of substrate material in an area of the backside of the substrate to form a trench in a vicinity of a gap between capacitor pads of the at least one qubit. In an embodiment, removing the amount of substrate material in the area of the backside of the substrate to form the trench in the vicinity of the gap between the capacitor pads of the at least one qubit includes removing the amount of substrate material so that the trench is substantially centered around the gap between the capacitor pads of the at least one qubit. In an embodiment, removing the amount of substrate so that the trench is substantially centered around the gap between the capacitor pads of the at least one qubit includes forming the trench to reduce a participation rate of surface states with RF energy density for silicon-metal (SM) interfaces and increasing a participation rate of surface states with the RF energy density for silicon-air (SA) interfaces. In an embodiment, the RF energy density overlap with surface states in silicon-metal (SM) interfaces is reduced and the surface state RF energy density overlap for silicon-air (SA) interfaces is increased with increasing depth of the trench.

In an embodiment, removing the amount of substrate material from the backside of the substrate includes removing the amount of substrate material in an area of the backside of the substrate to form a trench in a vicinity of a gap between capacitor pads of the at least one qubit and depositing the superconducting metal layer within the trench so as to reduce the radiofrequency electrical current loss due to metal-air (MA) interfaces. In an embodiment, forming the trench in the vicinity of the gap between capacitor pads of the at least one qubit includes forming the trench below and centered around one of the capacitor pads of the at least one qubit. In an embodiment, the radiofrequency electrical current loss due to metal-air (MA) interface is decreased based on a backside width of the trench.

In an embodiment, removing the substrate material from the backside of the substrate at the area opposite the at least one qubit includes applying an etch mask film to the backside of the substrate and etching the selected area at the backside of the substrate opposite the at least one qubit. In an embodiment, subsequent to applying the etch film mask to the backside of the substrate and prior to etching the selected area at the backside of the substrate, forming one or more openings in the etch film mask at the selected area. In an embodiment, etching the selected area at the backside of the substrate opposite the at least one qubit includes chemically etching a desired thickness of the substrate at the selected areas to form a trench at the selected area. In an embodiment, the method further includes depositing the superconducting metal layer within the trench.

In an embodiment, removing the substrate material from the backside of the substrate at the area opposite the at least one qubit includes applying a mask film to the backside of the substrate and depositing metal superconductor on masked areas of the backside of the substrate.

As it can be appreciated from the above paragraphs, it is further provided a quantum mechanical device. The quantum mechanical device includes 1) a substrate having a frontside and a backside; and 2) a plurality of qubits formed on the frontside of the substrate, the plurality of qubits including a plurality of capacitor pads. The substrate includes at least one trench formed on the backside of the substrate opposite at least one qubit of the plurality of qubits. At least one of a size, a shape, or a position of the at least one trench or a superconducting material deposited therein are selected to reduce radiofrequency electrical current loss due to at least one of silicon-air (SA) interface, metal-air (MA) interface or silicon-metal (SM) interface, or any combination thereof, so as to enhance a lifetime (T1) and a coherence time (T2) in the at least one qubit.

In an embodiment, the substrate can be any one of silicon, high resistivity silicon, and sapphire. In an embodiment, the plurality of capacitor pads are made from a superconducting material. In an embodiment, the superconducting material can be any one of aluminum (Al) and niobium (Nb).

In an embodiment, the trench is provided in a vicinity of a gap between two capacitor pads of the plurality of capacitor pads. In an embodiment, the trench is substantially centered around the gap so as to reduce surface state energy density for silicon-metal (SM) interface and to increase surface state energy density for silicon-air (SA) interface.

In an embodiment, the superconducting metal layer is provided within the trench so as to reduce the radiofrequency electrical current loss due to metal-air (MA) interface. In an embodiment, the trench is formed below and centered around one or more of the plurality of capacitor pads.

The above backside etching method has many benefits: Different loss mechanisms (i.e. bulk silicon loss tangent, SA, MA, and SM surface states) have different magnitudes, and the qubit RF total loss is essentially a weighted linear addition of all the loss contributors, such that the weighting is dictated by RF field strength overlap with the various loss mechanisms. These loss mechanisms happen to be associated with specific geometric features within the Qubit. The RF overlap with the bulk silicon, air, and the SA, MA, and SM surface state interfaces is modified through the use of wafer backside etching. We note that reducing the energy density overlap with a given device geometry surface(s) typically increases the energy density overlap with other surfaces in the device geometry, as long as the overall size of the device electrodes is not significantly changed. Therefore, the above described methods can be used when one surface creates a higher potential for adding to the RF loss than other surface types. The changes in the amount of RF overlap with the various interfaces, and the bulk substrate (whether it is a silicon substrate or another substrate material), is used to minimize the overall RF loss via wafer backside etching and/or backside metalization. Therefore, T1 and T2 can be increased (e.g., maximized) by reducing (e.g., minimizing) the overall loss through increasing the RF overlap with low loss geometric features and decreasing the RF overlap with higher loss features. We also note that different fabrication facilities and process flows may impact which material interface contributes the most to RF loss, so the interface of most concern is process flow and/or fabrication line dependent. Therefore, it is beneficial to have a flexible strategy for RF loss minimization, since different fabrication lines may require a different balance of RF overlap strengths with different qubit geometric features to minimize how the various RF loss mechanisms contribute to the overall loss.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method for improving lifetime and coherence time of a qubit in a quantum mechanical device, comprising:
   providing a substrate having a frontside and a backside, the frontside having at least one qubit formed thereon, the at least one qubit comprising a first capacitor pad and a second capacitor pad having a gap reserved therebetween; and
   removing an amount of substrate material from the backside of the substrate at least at an area below said gap to reduce radiofrequency electrical current loss due to at least one of silicon-air (SA) interface, metal-air (MA) interface or silicon-metal (SM) interface so as to enhance a lifetime (T1) and a coherence time (T2) in the at least one qubit.

2. The method according to claim 1, wherein reducing radiofrequency electrical current loss comprises reducing the radiofrequency electrical current loss by increasing radiofrequency overlap with lower loss geometric features in the quantum mechanical device and decreasing radiofrequency overlap with higher loss geometric features in the quantum mechanical device.

3. The method according to claim 1, wherein removing the amount of the substrate material from the backside of the substrate at least at the area below said gap comprises chemically etching the backside of the substrate selectively using a chemical etchant selected depending on the substrate material.

4. The method according to claim 3, wherein prior to chemically etching the backside of the substrate, forming an initial cavity in the backside of the substrate in a vicinity of the at least one qubit by mechanically removing material from the backside of the substrate and then chemically etching the backside of the substrate at the formed initial cavity with the chemical etchant.

5. The method according to claim 4, wherein forming the initial cavity in the backside of the substrate comprises defining faces of the initial cavity having one or more first crystal planes and one or more second crystal planes so that the chemical etchant preferentially etches the substrate material from said one or more first crystal planes while substantially not etching substrate material from said one or more second crystal planes to form an etched final cavity in the vicinity of the at least one qubit.

6. The method according to claim 1, wherein removing the amount of substrate material from the backside of the substrate comprises removing the amount of substrate material in an area of the backside of the substrate to form a trench below the gap between the first capacitor pad and the second capacitor pad of the at least one qubit.

7. The method according to claim 6, wherein removing the amount of substrate material in the area of the backside of the substrate to form the trench below the gap between the first capacitor pad and the second capacitor pad of the at least one qubit comprises removing the amount of substrate material so that the trench is substantially centered around the gap between the first capacitor pad and the second capacitor pad of the at least one qubit.

8. The method according to claim 7, wherein removing the amount of substrate material so that the trench is substantially centered around the gap between the first capacitor pad and the second capacitor pad of the at least one qubit comprises forming the trench to reduce a participation rate of surface states with RF energy density for silicon-metal (SM) interface and increasing a participation rate of surface states with the RF energy density for silicon-air (SA) interface.

9. The method according to claim 6, wherein a surface state RF energy density overlap in silicon-metal (SM) interface is reduced and the surface state RF energy density overlap for silicon-air (SA) interface is increased with increasing depth of the trench.

10. The method according to claim 1, wherein removing the amount of substrate material from the backside of the substrate comprises
   forming a trench below the gap between the first capacitor pad and the second capacitor pad of the at least one qubit; and further comprising depositing a superconducting metal layer within the trench at the backside of the substrate.

11. The method according to claim 10, wherein forming the trench below the gap between the first capacitor pad and the second capacitor pad of the at least one qubit comprises forming the trench below and centered around one of the first capacitor pad and the second capacitor pad of the at least one qubit.

12. The method according to claim 10, wherein the radiofrequency electrical current loss due to metal-air (MA) interface is decreased based on a backside width of the trench.

13. The method according to claim 1, wherein removing the amount of the substrate material from the backside of the substrate comprises applying an etch mask film to the backside of the substrate and etching a selected area at the backside of the substrate opposite the at least one qubit.

14. The method according to claim 13, further comprising: subsequent to applying the etch mask film to the backside of the substrate and prior to etching the selected area at the backside of the substrate, forming one or more openings in the etch mask film at the selected area.

15. The method according to claim 13, wherein etching the selected area at the backside of the substrate opposite the at least one qubit comprises chemically etching a desired thickness of the substrate to form a trench at the selected area.

16. The method according to claim 15, further comprising depositing a superconducting metal layer within the trench.

17. The method according to claim 1, wherein removing the amount of the substrate material from the backside of the substrate at the area opposite the at least one qubit comprises applying a mask film to the backside of the substrate and depositing a metal superconductor layer on masked areas of the backside of the substrate.

18. A quantum mechanical device, comprising:
a substrate having a frontside and a backside; and
a plurality of qubits formed on the frontside of the substrate, the plurality of qubits comprising a first capacitor pad and a second capacitor pad having a gap reserved therebetween,
wherein the substrate comprises at least one trench formed on the backside of the substrate opposite at least one qubit of the plurality of qubits, at least at an area below said gap, and
wherein at least one of a size, a shape, or a position of the at least one trench are selected to reduce radiofrequency electrical current loss due to at least one of silicon-air (SA) interface, metal-air (MA) interface or silicon-metal (SM) interface, or any combination thereof, so as to enhance a lifetime (T1) and a coherence time (T2) in the at least one qubit.

19. The quantum mechanical device according to claim 18, wherein the substrate is selected from the group consisting of silicon, and sapphire.

20. The quantum mechanical device according to claim 19, wherein the first capacitor pad and the second capacitor pad are made from a superconducting material.

21. The quantum mechanical device according to claim 20, wherein the superconducting material is selected from the group consisting of aluminum (Al) and niobium (Nb).

22. The quantum mechanical device according to claim 18, wherein the at least one trench is provided below the gap between the first capacitor pad and the second capacitor pad.

23. The quantum mechanical device according to claim 22, wherein the at least one trench is substantially centered around the gap so as to reduce surface state energy density for silicon-metal (SM) interface and to increase surface state energy density for silicon-air (SA) interface.

24. The quantum mechanical device according to claim 18, further comprising a superconducting metal layer provided within the at least one trench so as to reduce the radiofrequency electrical current loss due to metal-air (MA) interface.

25. The quantum mechanical device according to claim 24, wherein the at least one trench is formed below and centered around the first capacitor pad or the second capacitor pad.

* * * * *